United States Patent
Kim

(10) Patent No.: US 6,741,114 B2
(45) Date of Patent: May 25, 2004

(54) APPARATUS FOR ADJUSTING INPUT CAPACITANCE OF SEMICONDUCTOR DEVICE AND FABRICATING METHOD

(75) Inventor: Taek Seung Kim, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/006,566

(22) Filed: Dec. 10, 2001

(65) Prior Publication Data

US 2002/0167348 A1 Nov. 14, 2002

(30) Foreign Application Priority Data

May 10, 2001 (KR) .......................................... 2001-25523

(51) Int. Cl.[7] ................................................ H03K 5/08
(52) U.S. Cl. ........................ 327/310; 327/379; 327/382
(58) Field of Search ................................ 327/378, 379, 327/382, 388, 392, 393, 396, 310, 554, 553; 324/322; 330/126; 361/91.1, 91.3

(56) References Cited

U.S. PATENT DOCUMENTS

| 5,121,075 A | * | 6/1992 | Roach | 330/126 |
|---|---|---|---|---|
| 5,283,631 A | | 2/1994 | Koerner et al. | 326/121 |
| 5,852,388 A | | 12/1998 | Nakai et al. | 331/177 |
| 6,154,395 A | | 11/2000 | Saka | 365/193 |
| 6,445,257 B1 | * | 9/2002 | Cox et al. | 331/117 |
| 6,459,265 B1 | * | 10/2002 | Lou et al. | 324/322 |
| 6,496,403 B2 | * | 12/2002 | Noda et al. | 365/63 |
| 6,534,831 B2 | * | 3/2003 | Kato | 257/347 |

FOREIGN PATENT DOCUMENTS

| JP | 11-74757 A | 3/1999 |
|---|---|---|
| JP | 2000-22082 A | 1/2000 |
| JP | 2000-031386 A | 1/2000 |
| JP | 2000-214190 A | 8/2000 |

* cited by examiner

Primary Examiner—Tuan T. Lam
Assistant Examiner—Hiep Nguyen
(74) Attorney, Agent, or Firm—Birch, Stewart, Kolasch & Birch, LLP

(57) ABSTRACT

An apparatus for finely adjusting the input capacitance of a semiconductor device and a method of fabricating the apparatus are disclosed. The invention adjusts finely the input capacitance without increasing a layout area of the device by using a capacitor constructed with a poly layer/device isolation layer/P-type substrate. The poly layer is formed on an unnecessary space provided by the device isolation layer under an input pad.

13 Claims, 6 Drawing Sheets

APPARATUS FOR ADJUSTING INPUT CAPACITANCE OF SEMICONDUCTOR DEVICE AND FABRICATING METHOD

RELATED APPLICATION

The present application claims the benefit of Korean Patent Application No. 2001-25523 filed on May 10, 2001, which is herein fully incorporated by reference.

BACKGROUND OF THE INVENTION

1. Field of the Invention

The present invention relates to an apparatus for adjusting finely the input capacitance of a semiconductor device without increasing a layout area of the device, and to a method of fabricating the apparatus.

2. Discussion of the Related Art

FIG. 1 illustrates a block diagram of an input part 5 of a semiconductor memory device according to a related art. As shown in FIG. 1, the input part 5 includes an input pad 10 for transmitting an input signal IN as a signal A, an Electro-Static Discharge (ESD) protection circuit 20 for limiting a passage of ESD as it transmits the signal A to protect the internal circuitry of the memory device, an input buffer 30 for outputting a signal B by converting the level of an output signal of the ESD protection circuit 20 into an appropriate internal logic level of the memory device, and a controller & memory cell array 40 for producing an internal operation signal OUT based on the output signal B of the input buffer 30. These components of the input part 5 are implemented on a chip.

FIG. 2 illustrates a detailed circuit diagram of the ESD protection circuit 20 and the input buffer 30 shown in FIG. 1. As shown in FIG. 2, the ESD protection circuit 20 is constructed with a resistor R1 connected between an input node Nd1 and an output node Nd2, and an NMOS type transistor N1 connected between the output node Nd2 and a ground voltage Vss. As the drain and the gate of the transistor N1 are connected together, the transistor N1 acts as a diode. The input node Nd1 receives the output signal A of the input pad 10. The input buffer 30 includes a buffer 32 connected between the output node Nd2 and the controller and memory cell array 40 for generating and outputting the signal B to the controller & memory cell array 40.

The input capacitance at an input stage of the semiconductor device varies depending on a junction capacitance Cj at a P-N junction of the NMOS transistor N1 of the ESD protection circuit 20 connected to the input stage and depending on a gate capacitance Cg of the input buffer 30 connected to the input stage. Since the input capacitance affects the operation of the semiconductor device, the ESD protection circuit 20 and input buffer 30 are generally designed to provide a desired input capacitance for the semiconductor device.

However, even if all the input parts have been designed to provide the desired input capacitance for the semiconductor device, the input capacitance considered outside a chip is different in accordance with input pins which thwarts this effort for obtaining the desired input capacitance. Due to the length difference in a lead-frame and a bonding wire between the input pins in a semiconductor package, input capacitance varies from 7 to 10% depending on the input pins. This causes a significant difference between the operational characteristics of different input pins, which degrades the operation and performance of the semiconductor device.

To overcome this problem, a circuit for adjusting the input capacitance of the input pins has been proposed. However, in this case, the layout area of the semiconductor device is increased due to the addition of this new circuit. This increases the overall size of the semiconductor device. Therefore, there is a need for an apparatus for adjusting the input capacitance of the semiconductor device without requiring an additional layout area.

SUMMARY OF THE INVENTION

Accordingly, the present invention is directed to a fine-adjustment circuit and a fabricating method thereof for adjusting the input capacitance of a semiconductor device that substantially obviate one or more of the problems due to limitations and disadvantages of the related art.

An object of the present invention is to provide a fine-adjustment circuit for input capacitance in a semiconductor device that adjusts an input capacitance value of an input node by selectively connecting a plurality of capacitors connected between the input node, which is between an input pad part and an ESD protection circuit part, and a ground voltage.

Another object of the present invention is to provide a method of fabricating a fine-adjustment circuit for input capacitance in a semiconductor memory device that adjusts an input capacitance finely without increasing its layout area by constructing a capacitor with a poly layer/device isolation layer/P-type substrate and forming the poly layer on the device isolation layer under an input pad.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In connection with the above objectives of the present invention, an input part in a semiconductor memory device is disclosed herewith. In the input part, a fine-adjustment circuit for a capacitance according to the present invention adjusts an input capacitance of a semiconductor memory device and is established under an input pad. An input node corresponds to a connection node between the input pad and an ESD protection circuit.

The input capacitance adjustment circuit includes a plurality of capacitors each of which one end is connected to a ground, and a plurality of option switches for connecting the other ends of the capacitors to the input node or the ground respectively. The capacitor is constructed with a poly layer as a top plate, an isolation layer as a dielectric layer, and a P substrate area as a bottom plate.

To achieve these and other advantages, and in accordance with the purpose of the present invention as embodied and broadly described, an input part in a semiconductor memory device according to the present invention includes an input pad to which an input signal is input from an external source, an ESD protection circuit for protecting an internal circuit by preventing ESD input through the input pad part, an input buffer for converting an input signal received from the input pad into an internal logic level of the semiconductor memory device, and an input capacitance adjustment circuit established under the input pad so as to adjust an input capacitance of the semiconductor memory device.

In another aspect of the present invention, a method of fabricating a fine-adjustment circuit for an input capacitance in a semiconductor memory device according to the present invention includes the steps of providing a P-type substrate in which first to third device isolation layers are formed, forming an N-type well having a P-type impurity region inside between the first and second device isolation layers and forming an active area to form an N-type MOS transistor between the second and third device isolation layers, forming an oxide layer and a polysilicon layer on the entire structure successively, forming a first area by patterning the oxide and polysilicon layers to remain on the first device isolation layer as well as forming a gate on the active area, forming source/drain regions in the P-type substrate below both lateral sides of the gate by carrying out N-type impurity ion implantation, depositing a first insulating interlayer having a predetermined thickness on the entire structure, forming contact holes by etching predetermined portions of the first insulating interlayer on the drain region, P-type impurity region and first area, forming a first metal line on the entire structure including the contact hole, forming a second area connected to the polysilicon layer of the first area and a predetermined portion of the P-type impurity region and a third area contacted electrically with the P-type impurity region and drain region and connected to an input buffer part by patterning the first metal line, forming a second insulating interlayer on the entire structure and then forming a contact hole exposing the first area, and forming a second metal line on the entire structure including the latter contact hole and then forming an input pad by patterning the second metal line. In one embodiment, an internal-contact option layer is formed in the first metal line of the second area so as to selectively connect the polysilicon layer in the first area to the first metal line which forms the input node connecting the input pad and the protection circuit, and a plurality of capacitors are formed using the P-type substrate, first device isolation layer, and polysilicon layer.

In a further aspect according to the present invention, a fine-adjustment circuit for adjusting an input capacitance finely in a semiconductor memory device, includes an input pad part for receiving an input signal, an ESD protection part for removing ESD by receiving a signal output from the input pad part, an input buffer part for receiving a signal output from the ESD protection part, converting the received signal into an internal logic level of the memory device, and outputting the converted signal, and an input capacitance adjustment part for adjusting a capacitance formed at a node between the input pad part and the ESD protection part by using at least one capacitor.

In one embodiment, the input capacitance adjustment part includes a plurality of capacitors each of which one end is connected to a ground voltage Vss, and a plurality of switches selectively connecting the other ends of the capacitors to the input node or the ground voltage Vss respectively.

As mentioned in the above description, a fine-adjustment circuit and a method of fabricating the fine-adjustment circuit thereof according to the present invention finely adjust an input capacitance of a semiconductor memory device without increasing a layout area of the semiconductor memory device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENTS

Figure 1:
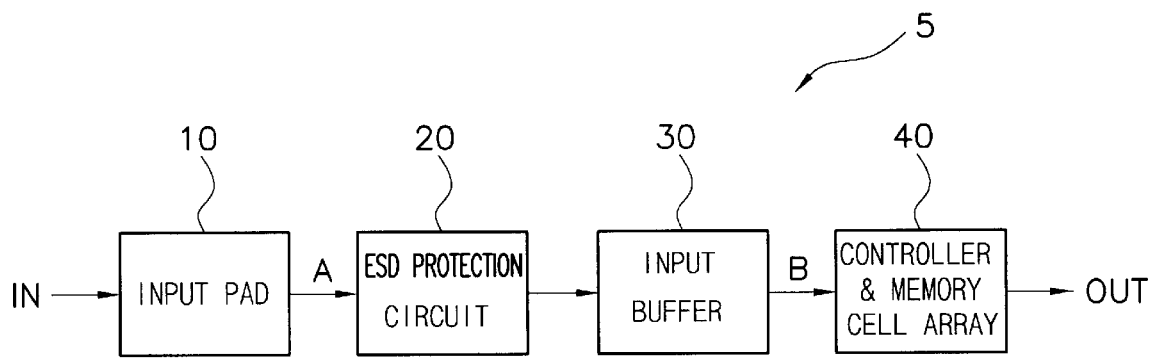
FIG. 1 illustrates a block diagram of an input part of a semiconductor memory device according to a related art.
Figure 2:
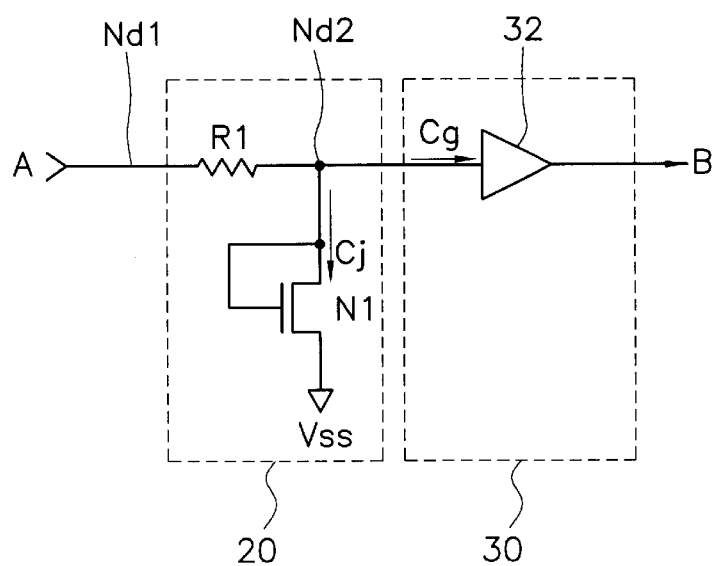
FIG. 2 illustrates a circuit diagram of an ESD protection circuit and an input buffer of the input part shown in FIG. 1.

Reference will now be made in detail to the preferred embodiments of the present invention, examples of which are illustrated in the accompanying drawings. Where possible, the same reference numerals will be used to illustrate like elements throughout the specification.

Figure 3:
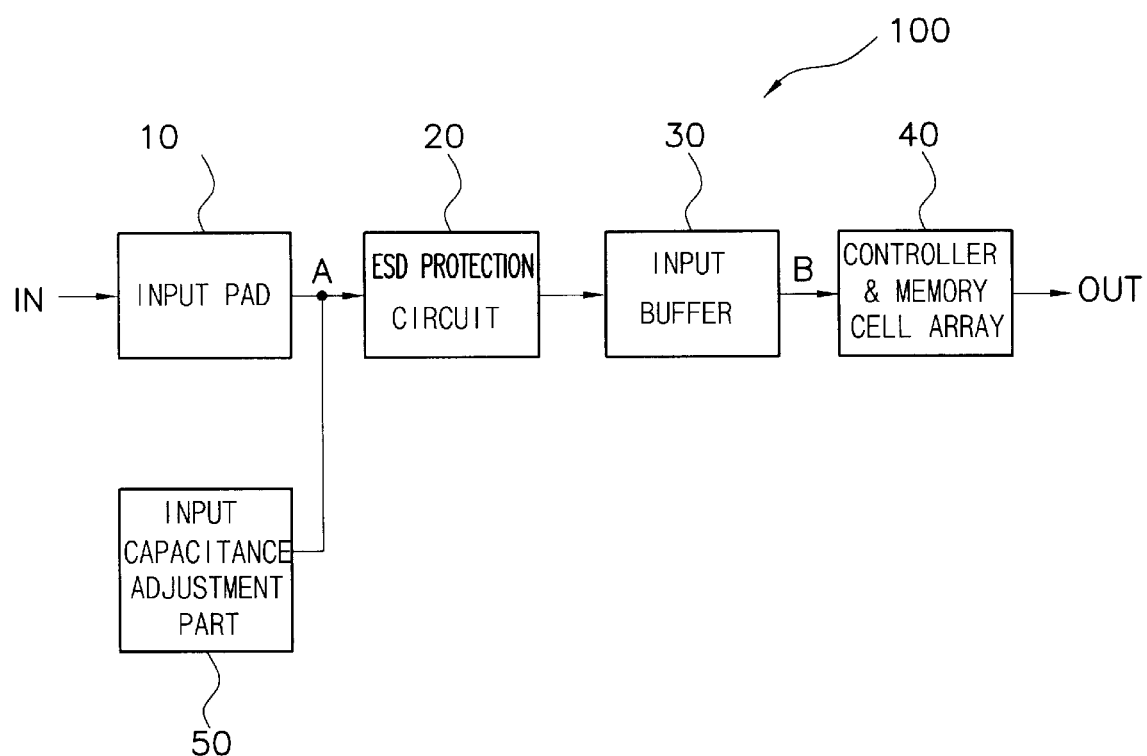
FIG. 3 illustrates a block diagram of an input part for a semiconductor device according to one embodiment of the present invention.

In the present invention, an input capacitance of a semiconductor device is finely adjusted without having to increase the layout area of the semiconductor device. This is accomplished by providing a capacitor composed of a poly layer, a device isolation layer and a p-type substrate and formed under an input pad of the semiconductor device. Particularly, FIG. 3 illustrates a block diagram of an input part 100 of a semiconductor device according to one embodiment of the present invention. Referring to FIG. 3, the input part 100 includes an input pad 10 for receiving an input signal IN from an external source and transmitting the input signal IN as an output signal A, an ESD protection circuit 20 for protecting the internal circuitry of the semiconductor device by controlling a passage of ESD as it transmits the output signal A, an input buffer 30 for converting the level of an output signal of the ESD protection circuit 20 into an appropriate internal logic level of the memory device and thereby outputting a signal B, a controller & memory cell array 40 for producing an internal operation signal OUT based on the output signal B of the input buffer 30, and an adjustment part 50 for adjusting finely the input capacitance of the semiconductor device. All the components of the input part 100 are operatively connected and configured, and can be implemented on a chip or the like.

The controller portion of the component 40 generates the internal operation signal OUT for the semiconductor device based on the output signal B of the input buffer 30. The memory cell array portion of the component 40 stores data and information therein in accordance with the internal operation signal OUT output from the controller portion of the component 40 according to known techniques.

Figure 4:
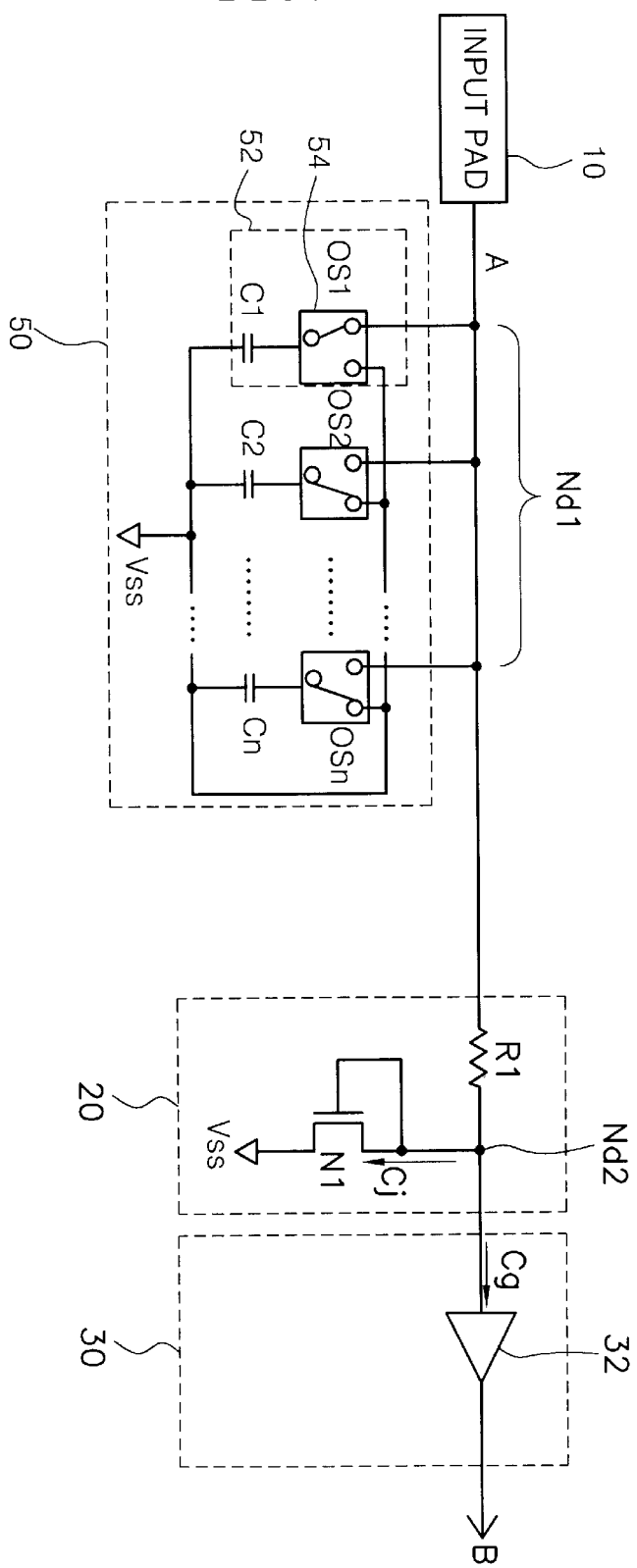
FIG. 4 illustrates a circuit diagram of an adjustment part, an ESD protection circuit and an input buffer of the input part of FIG. 3 according to one embodiment of the present invention.

FIG. 4 illustrates a circuit diagram of the input capacitance adjustment part 50, the ESD protection circuit 20 and the input buffer 30 of the input part 100 of FIG. 3 according to one embodiment of the present invention.

Referring to FIG. 4, the ESD protection circuit 20 is constructed with a resistor R1 connected between an input node Nd1 and an output node Nd2, and with an NMOS type diode N1 connected between the output node Nd2 and a ground voltage Vss. The input node Nd1 transmits the output signal A of the input pad 10 to the ESD protection circuit 20.

The input buffer 30 includes a buffer 32 connected between the output node Nd2 and the controller and memory cell array 40 and operates according to known techniques.

The input capacitance adjustment part 50 is constructed with a capacitor C1 having one end connected to the ground voltage Vss and with an option switch OS1 54 for switching between the input node Nd1 and the node connected directly to the ground voltage Vss. The capacitor C1 and the switch OS1 constitute an adjustment unit. In a preferred embodiment, the input capacitance adjustment part 50 include a plurality of adjustment units 52 connected in parallel to each other as shown in FIG. 4. For example, the input capacitance adjustment part 50 may includes a plurality of capacitors C1, C2 . . . Cn operatively coupled with a plurality of option switches OS1, OS2 . . . OSn.

In another embodiment, the input capacitance adjustment part 50 may include a single adjustment unit.

The input capacitance received at the input pad part 10 from an external source varies depending on input pins due to the length difference between lead-frames and bonding wires in semiconductor packages. Different input capacitances associated with the input pins have to be adjusted so as to prevent the degradation in the operational characteristics of the semiconductor device. To this purpose, the input capacitance adjustment part 50 of the present invention adjusts finely the input capacitance of the semiconductor device by being connected to one of the capacitors C1–Cn between the input pad 10 and the ESD protection circuit 20.

Figure 5:
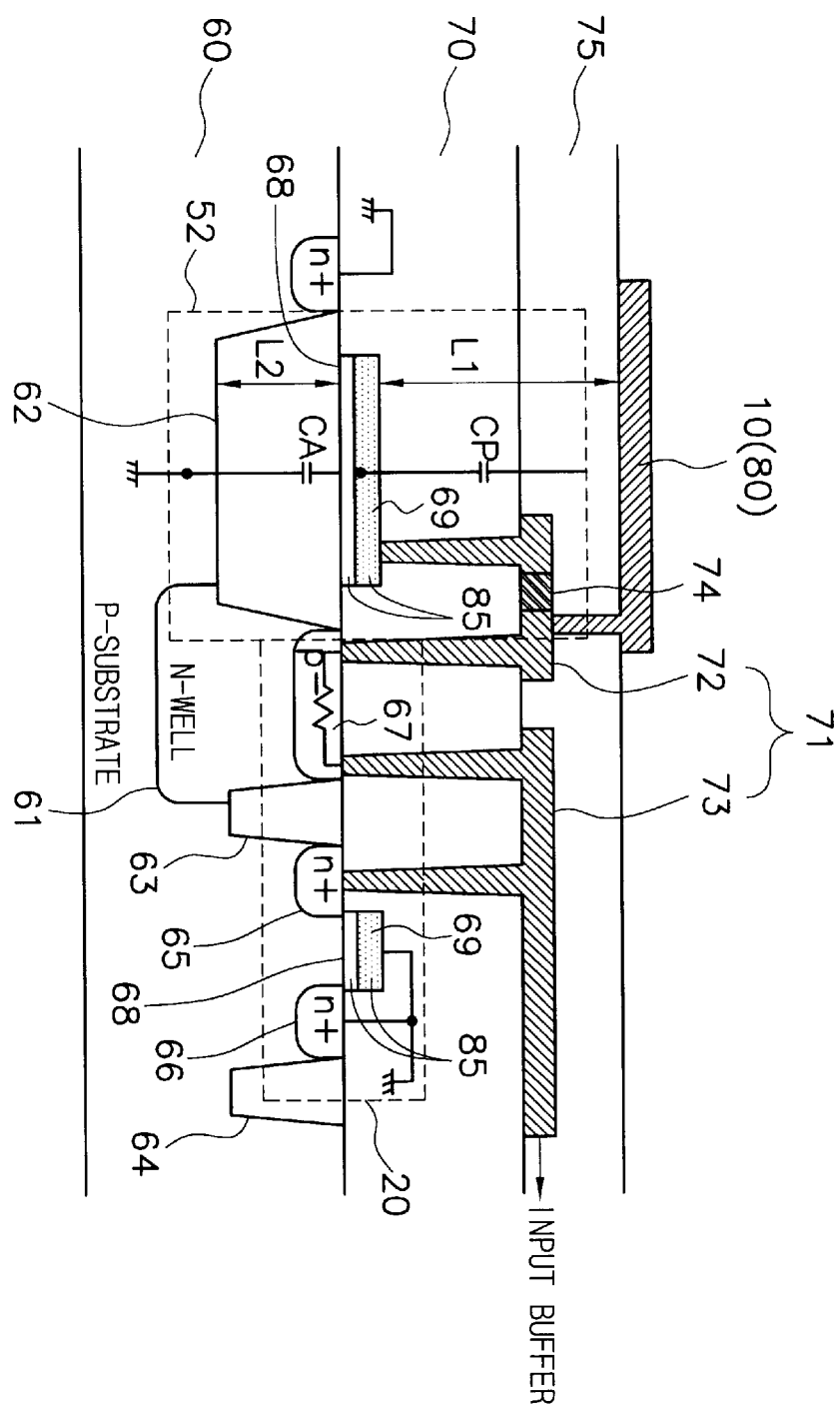
FIG. 5 illustrates a cross-sectional layer view of a semiconductor device containing the input part of FIG. 3 according to one embodiment of the present invention.

FIG. 5 illustrates a cross-sectional layer view of the input capacitance adjustment part 50 and other parts of the input part 100 according to one embodiment of the present invention.

Referring to FIG. 5, device isolation layers 62, 63 and 64 defining predetermined active areas are formed on a P-type substrate 60. An N-type well 61 is formed in the P-type substrate 60 between the device isolation layers 62 and 63. This can be accomplished by carrying out an N-type impurity ion implantation process. A P-type impurity region 67 is then formed in the N-type well 61, e.g., by performing a P-type impurity ion implantation process.

A gate insulating layer 68 and a polysilicon layer 69 are successively formed on the resultant structure. The polysilicon and gate insulating layers 69 and 68 are then patterned selectively so as to form gate electrodes 85 on the P-type substrate 60. In this case, predetermined portions of the polysilicon and gate insulating layers 69 and 68 are formed on the device isolation layer 62.

Subsequently, source/drain regions 65 and 66 are formed at the P-type substrate 60 below the lateral sides of the gate electrode 85. This can be accomplished by using an N-type impurity ion implantation process.

Then, a first insulating interlayer 70 having a predetermined thickness is deposited on the entire resultant structure. Contact holes are then formed by selectively removing the first insulating interlayer 70 using photolithography or other processes so as to expose predetermined portions of the drain region 65, the P-type impurity region 67, and the polysilicon layer 69 on the device isolation layer 62. In this case, a pair of the contact holes are formed on the P-type impurity region 67.

Then a metal layer 71 is formed on the entire structure including the contact holes. Thereafter, a first metal line 72 for electrically connecting the polysilicon layer 69 formed on the device isolation layer 62 to the first metal line 67 through an internal-contact option layer 74, and a second metal line 73 connected to both the P-type impurity region 67 and drain region 65, are formed by selectively patterning the metal layer 71. In this case, the second metal line 73 is connected to an input terminal of the input buffer 30. The internal-contact option layer 74 may be formed by patterning the metal layer 71 or using another metal line layer.

A second insulating interlayer 75 is formed on the entire structure where the first and second metal lines 72 and 73 are formed. A contact hole is then formed by removing selectively the second insulating layer 75 so as to expose a portion of the first metal line 72. Then a metal layer 80 is formed over the resultant structure and patterned to produce the input pad 10 which contacts the first metal line 72.

The capacitor CA (C1, C2, . . . or Cn) of the input capacitance adjustment part 50 is constructed with the polysilicon layer 69 and the device isolation layer 62. In this case, the polysilicon layer 69 functions as a top plate of the capacitor, the device isolation layer 62 functions as a dielectric layer of the capacitor, and the P-type substrate 60 is a bottom plate of the capacitor. The capacitor CA including the polysilicon layer 69 may be connected to the input node Nd1 through the internal-contact option layer 74.

When the polysilicon layer 69 is connected to the ground voltage Vss instead of the input node Nd1, potentials of the polysilicon layer 69 and the P-type substrate 60 become equal to each other. Thus, in this case, the polysilicon layer 69 and the P-type substrate 60 do not function as a capacitor. Instead, a new capacitor CP is then formed between the input pad 10 and the polysilicon layer 69. Yet, in general, a thickness L1 of the insulating interlayer 70 between the input pad 10 and the polysilicon layer 69 is formed about ten (10) times thicker than that a thickness L2 of the device isolation layer in a semiconductor memory.

As a result, the contribution of the capacitor CP to the total input capacitance of the semiconductor device is negligible. In this manner, fine adjustment of the input capacitance of the semiconductor device is possible within 5 to 10% range by connecting the capacitor CA constructed with the polysilicon layer 69/device isolation layer 62/P-type substrate 60 to the input node Nd1, or by removing the capacitor CA therefrom.

In a general case, the input part of the present invention is designed within a particular range to satisfy desired input capacitance characteristics. The present invention is capable of providing input capacitance adjustment that compensates for input variance characteristics associated with different input pins in the range of, e.g., 5 to 10%.

Figure 6A:
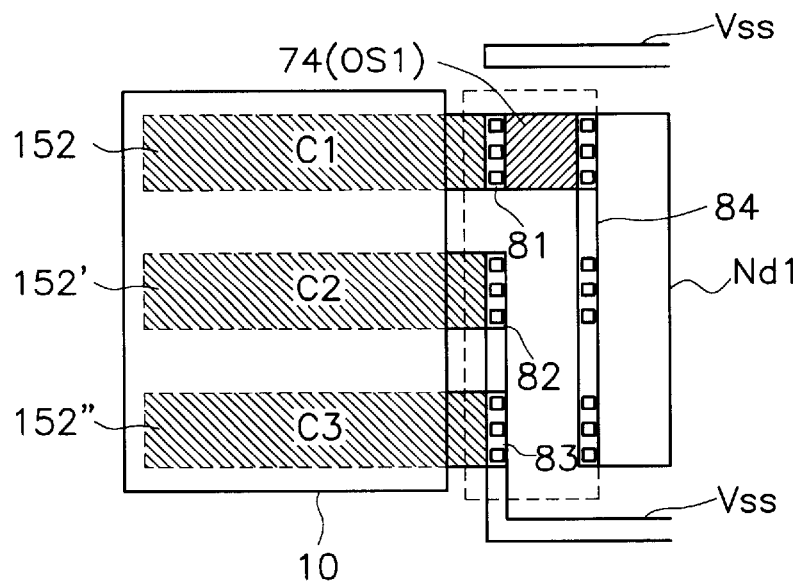
FIGS. 6A to 6C illustrate layout views of an adjustment part usable in the input part of FIG. 3 according to different embodiments of the present invention.
Figure 6B:
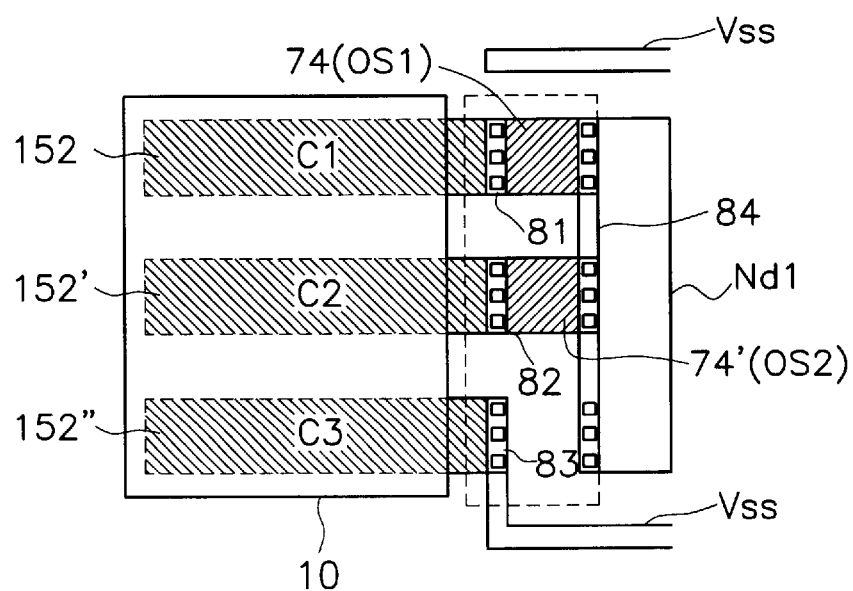
Figure 6C:
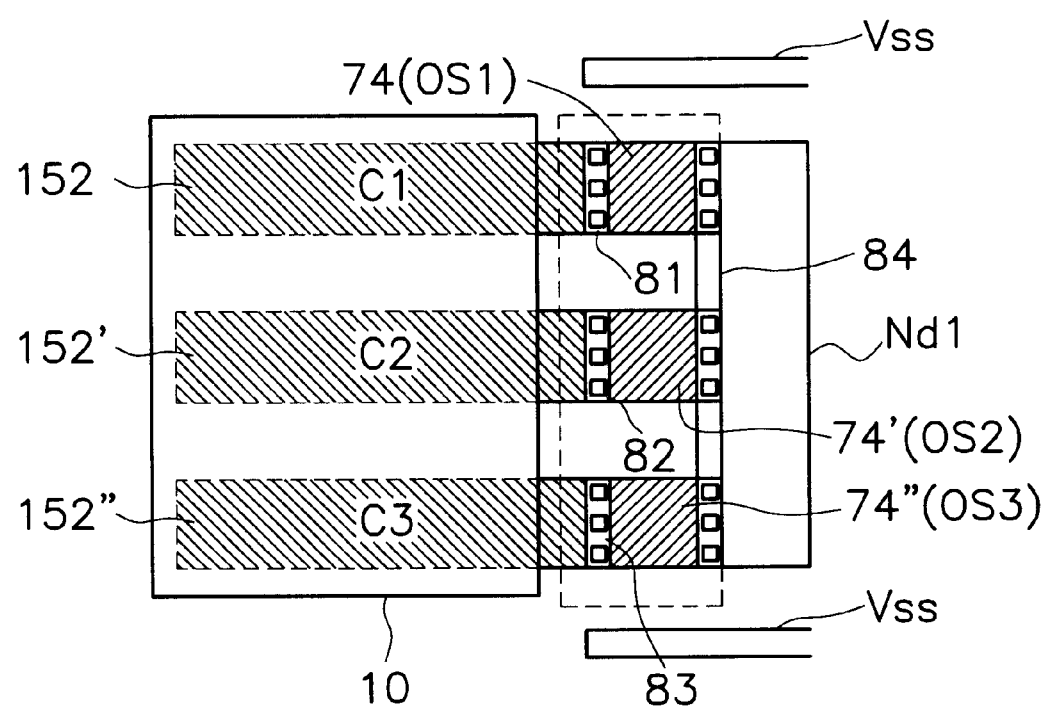

FIGS. 6A to 6C illustrate bottom plan layout views for explaining different embodiments of adjusting the input capacitance by using an input capacitance adjustment part according to the present invention. Here, the input capacitance adjustment part of the present invention includes one or more of adjustment units 52, 52' and 52" that are connected to an input node Nd1 or a ground voltage Vss through an option switch OSn 54. Each adjustment unit 52, 52', or 52" includes a polysilicon layer 152, 152', or 152" and an option layer 74, 74', or 74". Here, the polysilicon layer 152, 152', or 152" represents the polysilicon layer 69 of the corresponding capacitor C1 . . . Cn.

Referring to FIG. 6A, in accordance with one embodiment, first to third polysilicon layers 152, 152', and 152" are formed underneath an input pad 10. The first polysilicon layer 152 is connected electrically to the input node Nd1 through one option switch OS1, and the second and third polysilicon layers 152' and 152" are connected to a ground voltage Vss line. In this case, the first polysilicon layer 152 is connected electrically to the input node Nd1 through an internal-contact option layer 74 of the option switch OS1. Elements 81, 82, 83 and 84 are connectors.

Referring to FIG. 6B, in another embodiment, the first to third polysilicon layers 152, 152', and 152" are formed underneath the input pad 10. The first and second polysilicon layers 152 and 152' are connected electrically to the input node Nd1 through option switches OS1 and OS2, and the third polysilicon layer 152" is connected to the ground voltage Vss line. In this case, the first and second polysilicon layers 152 and 152' are connected to the input node Nd1 through internal-contact option layers 74 and 74' of the option switches OS1 and OS2.

Referring to FIG. 6C, in still another embodiment, first to third polysilicon layers 152, 152', and 152" are formed underneath an input pad 10. The first to third polysilicon layers 152, 152' and 152" are connected electrically to the input node Nd1 through the option switch OS1, OS2 and OS3. In this case, the first to third polysilicon layers 152, 152', and 152" are connected electrically to the input node Nd1 through internal-contact option layers 74, 74' and 74" of the option switches OS1, OS2 and OS3, respectively.

If it is desired to increase the input capacitance of the input node Nd1, as shown in FIG. 6C, the number of the polysilicon layers connected to the input node Nd1 is increased. If it is desired to decrease the input capacitance of the input node Nd1, as shown in FIG. 6A, the number of the polysilicon layers connected to the input node Nd 1 is reduced. That is, the switching of each option switch OS1 . . . Osn between the input node Nd1 and the ground is implemented by providing the option layer 74, 74', or 74" in accordance with the desired input capacitance. Therefore, an adjustment value for the input capacitance of the input node Nd1 depends on whether one or more polysilicon layers are connected to the input node Nd1 or the ground voltage Vss through the option switches OS1 . . . OSn.

As mentioned in the above description, a fine-adjustment circuit for input capacitance in a semiconductor device and a fabricating method thereof according to the present invention finely adjust the input capacitance of the semiconductor device without increasing a layout area of the semiconductor device. This is accomplished by forming a polysilicon layer 69 over a device isolation layer under an input pad 10 so as to form a plurality of capacitors constructed with the polysilicon layer 69/device isolation layer 62/P-type substrate 60 and by selectively connecting one or more of these capacitors.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. An input part for a semiconductor device, comprising:
    an input pad for receiving an input signal from an external source;
    an ESD protection circuit coupled with the input pad for preventing ESD inputted through the input pad;
    an input buffer for converting an output signal of the input pad; and
    an adjustment part formed under the input pad and coupled with an input terminal of the protection circuit for adjusting an input capacitance of the semiconductor device.

2. The input part of claim 1, wherein a connection node between the input pad and the protection circuit is an input node, and
    wherein the adjustment part includes:
        a plurality of capacitors each having an end connected to a ground, and
        a plurality of option switches for connecting another end of each of the capacitors to the input node or the ground, so as to adjust the input capacitance of the semiconductor device.

3. The input part of claim 2, wherein at least one of the capacitors is constructed with a poly layer functioning as a top plate of the capacitor, an isolation layer functioning as a dielectric layer of the capacitor, and a substrate functioning as a bottom plate of the capacitor.

4. A method of adjusting input capacitance of input pins in a semiconductor device, the method comprising the steps of:
    providing a plurality of capacitors, one end of each of the capacitors connected to a ground and
    connecting another end of each of the capacitors to an input pad selectively or the ground selectively in accordance with the capacitance of the corresponding capacitor.

5. An input structure for a semiconductor device, comprising:
    an input pad for receiving an input signal;
    an ESD protector coupled with the input pad for preventing ESD inputted through the input pad;
    an input buffer for converting an output signal of the input pad into a signal having an internal logic level of the semiconductor device;
    an input capacitance adjustment part formed under the input pad and coupled with an input terminal of the ESD protector so as to adjust finely an input capacitance of the semiconductor device;
    a controller for generating an internal operation signal for the semiconductor device based on the input signal; and
    a storage unit for storing data in accordance with the internal operation signal.

6. The input part of claim 5, wherein a connection node between the input pad and the ESD protector is an input node, and
    wherein the input capacitance adjustment part includes:
        a plurality of capacitors, one end of each of the capacitors being connected to a ground; and
        a plurality of option switches for connecting another end of each of the capacitors to the input node or the ground.

7. The input part of claim 6, wherein the option switches include contact layers connectable between polysilicon layers and the input node.

8. The input part of claim 6, wherein at least one of the capacitors is constructed with a poly layer functioning as a top plate of the capacitor, an isolation layer functioning as a dielectric layer of the capacitor, and a P- substrate functioning as a bottom plate of the capacitor.

9. In a semiconductor memory device, a circuit for adjusting an input capacitance of the semiconductor memory device, the circuit comprising:
    an input pad part for receiving an input signal from an external source;
    a circuitry protection part coupled with the input pad part for protecting circuitry of the semiconductor memory device;

an input buffer for converting an output signal of the circuitry protection part into a converted signal; and an input capacitance adjustment part formed under the input pad part and for adjusting a capacitance formed at an input node between the input pad part and the circuitry protection part by using at least one capacitor.

10. The circuit of claim 9, wherein the input capacitance adjustment part comprises:

a plurality of capacitors, one end of each of the capacitors being connected to a ground voltage; and a plurality of switches for connecting another end of each of the capacitors to the input node or the ground voltage.

11. An input part for a semiconductor device, comprising:

an input pad for receiving an input signal from an external source;

a protection circuit coupled with the input pad for electrically protecting the semiconductor device;

an input buffer for converting an output signal of the input pad; and an adjustment part coupled with the input pad for adjusting an input capacitance of the semiconductor device, wherein the adjustment part includes:

a plurality of capacitors each having an end connected to a ground, and a plurality of option switches for connecting another end of each of the capacitors to an input node or the ground, so as to adjust the input capacitance of the semiconductor device, the input node being a connection node between the input pad and the protection circuit.

12. An input structure for a semiconductor device, comprising:

an input pad for receiving an input signal;

an ESD protector coupled with the input pad for preventing ESD;

an input buffer for converting an output signal of the input pad into a signal having an internal logic level of the semiconductor device;

an input capacitance adjustment part coupled with the input pad so as to adjust finely an input capacitance of the semiconductor device;

a controller for generating an internal operation signal for the semiconductor device based on the input signal; and a storage unit for storing data in accordance with the internal operation signal, wherein the input capacitance adjustment part includes:

a plurality of capacitors, one end of each of the capacitors being connected to a ground; and a plurality of option switches for connecting another end of each of the capacitors to an input node or the ground, the input node being a connection node between the input pad and the ESD protector.

13. In a semiconductor memory device, a circuit for adjusting an input capacitance of the semiconductor memory device, the circuit comprising:

an input pad part for receiving an input signal from an external source;

a circuitry protection part coupled with the input pad part for protecting circuitry of the semiconductor memory device;

an input buffer for converting an output signal of the circuitry protection part into a converted signal; and an input capacitance adjustment part for adjusting a capacitance formed at an input node between the input pad part and the circuitry protection part by using at least one capacitor, wherein the input capacitance adjustment part includes:

a plurality of capacitors, one end of each of the capacitors being connected to a ground voltage; and a plurality of switches for connecting another end of each of the capacitors to the input node or the ground voltage.

\* \* \* \* \*